United States Patent [19]
Stuebing et al.

[11] Patent Number: 5,471,159
[45] Date of Patent: Nov. 28, 1995

[54] SETUP OR HOLD VIOLATION TRIGGERING

[75] Inventors: Carlton Stuebing, Tigard; George J. Caspell, Hillsboro, both of Oreg.

[73] Assignee: Tektronix, Inc., Wilsonville, Oreg.

[21] Appl. No.: 947,205

[22] Filed: Sep. 18, 1992

[51] Int. Cl.⁶ .................................................. H03K 5/22
[52] U.S. Cl. .............................. 327/24; 327/26; 327/31; 327/36
[58] Field of Search ..................................... 307/234, 514, 307/516, 525, 526, 601, 602, 603; 328/109, 110; 324/73.1; 375/106; 327/24, 26, 31, 36

[56] References Cited

U.S. PATENT DOCUMENTS

| | | | |
|---|---|---|---|
| 4,585,975 | 4/1986 | Wimmer | 315/392 |
| 4,647,862 | 3/1987 | Blair | 328/109 |
| 4,799,023 | 1/1989 | Firooz et al. | 328/110 |
| 4,823,076 | 4/1989 | Haines et al. | 324/121 R |
| 4,968,902 | 11/1990 | Jackson | 307/360 |
| 4,984,255 | 1/1991 | Davis et al. | 375/106 |
| 5,036,221 | 7/1991 | Brucculeri et al. | 328/109 |
| 5,088,106 | 2/1992 | Kitamura et al. | 307/602 |
| 5,097,147 | 3/1992 | Stuebing et al. | 307/354 |
| 5,115,208 | 5/1992 | Masdea et al. | 307/516 |
| 5,122,694 | 6/1992 | Bradford et al. | 307/480 |
| 5,124,597 | 6/1992 | Stuebing et al. | 307/601 |
| 5,338,990 | 8/1994 | Lou | 307/603 |

*Primary Examiner*—Willis R. Wolfe
*Attorney, Agent, or Firm*—Boulden G. Griffith

[57] ABSTRACT

One embodiment of a circuit and corresponding method for generating a trigger signal upon the occurrence of either set up or hold time violations in the same waveform acquisition produces a trigger signal referenced to, but displaced in time from, the input clock signal. Transitions (13) in a data signal initiate a window pulse (14') whose duration is equal to the sum of a set up time requirement and a hold time requirement. The window pulse is used as the D input to a flip-flop (20) that is clocked by a version of a clock signal whose active edge has been delayed (28) for an interval that corresponds to the hold time requirement. The output of the flip-flop (20) is a trigger signal that only occurs when a set up or hold time violation has occurred. In another embodiment, triggers generated as the result of a set up time violation are referenced to the clock edge, while triggers that are generated as the result of a hold time violation are referenced to a transition in the data signal. Data transitions (40) initiate a pulse (46) whose duration is the set up time. This pulse is the D input to a first flip-flop clocked by the clock signal. A second flip-flop (54) is clocked by data transitions and receives at its D input a pulse (48) that is initiated by an active edge of the clock signal and whose duration is the specified hold time. The outputs of the first and second flip-flops are ORed (56) to produce the trigger.

12 Claims, 7 Drawing Sheets

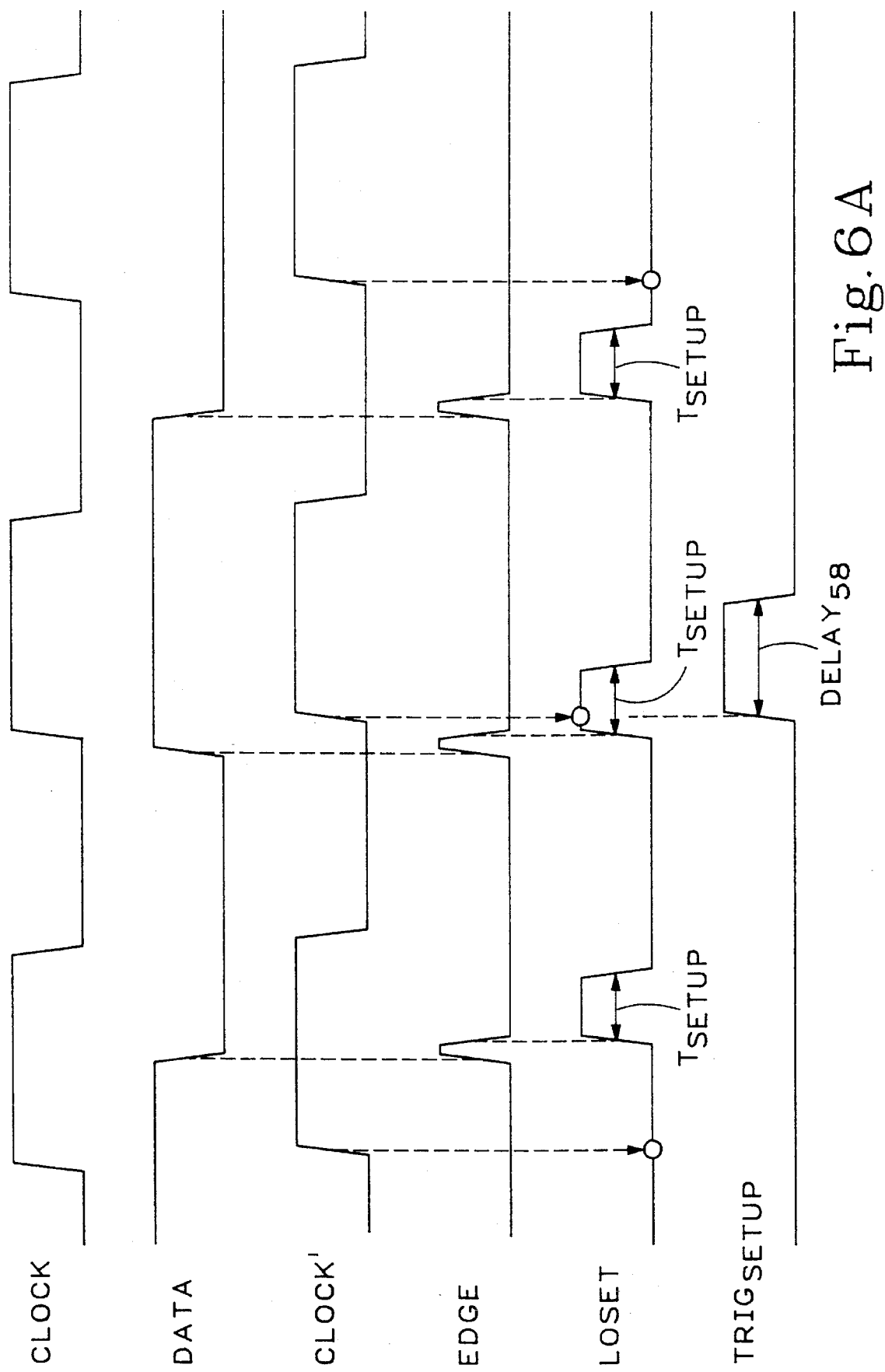

SETUP OR HOLD VIOLATION TRIGGERING

FIELD OF THE INVENTION

This invention relates to instrument triggering, and more particularly to oscilloscope or logic analyzer trigger generation that is responsive to the timing relationship between the user's clock signal and the user's data signal, i.e., set up time or hold time violations.

BACKGROUND OF THE INVENTION

When oscilloscopes are used to monitor a repetitive waveform, a trigger signal can be derived from the input signal by generating a trigger signal whenever the amplitude of the input signal exceeds a user controlled or automatically determined threshold. Typically, the user is provided with a level control to establish the triggering threshold and a slope ±control to determine whether the positive-going transition or the negative-going transition is to initiate the trigger signal.

To obtain a stable waveform display, it is necessary to trigger at an identical trigger point on the series of repetitive waveforms. U.S. Pat. No. 4,647,862 to Blair for a "Trigger Holdoff System tier a Digital Oscilloscope", hereby incorporated by reference, discloses one means for triggering at an identical point on a series of repetitive waveforms. A holdoff signal is used to provide a time delay between desired trigger events so that undesired events cannot cause an acquisition. The holdoff signal can thus be used to synchronize complex repetitive waveforms so that they appear stationary on a digital storage oscilloscope display.

In a digital storage oscilloscope, it is impossible to know in advance the time that an external, asynchronous signal will arrive in relation to the synchronous, internal clock system of the instrument. Since the holdoff signal mentioned above can be either an asynchronous signal or a signal that is synchronous with the internal clock, and the incoming triggering event is necessarily asynchronous to it, the use of these signals in the same circuit means that eventually the two signals will have every possible random timing relationship with each other. When digital circuit elements are exposed to mutually asynchronous inputs, a condition known as "metastability" can result. Metastability describes unpredictable and unreliable behaviors of a digital signal that can occur in the presence of asynchronous signals. For example, the output of a flip-flop exposed to such inputs can wander between defined logic states for an unpredictable amount of time. For additional background on the phenomenon of metastability, see "General Theory of Metastable Operation" by Leonard R. Marino from the IEEE Transactions on Computers, Vol. C-30, No. 2, February 1981.

Metastable behaviors in the trigger circuitry can lead to jitter and other undesirable clutter in the display. U.S. Pat. No. 5,122,694 to Bradford et al. for a "Method and Electrical Circuit for Eliminating Time Jitter Caused By Metastable Conditions in Asynchronous Logic Circuits", hereby incorporated by reference, discloses a circuit for generating a warning signal when input signal timing conditions are such as might permit metastable behaviors to occur. The warning signal can then be used to prevent triggering based on trigger signals that might be subject to metastable behaviors.

As the role of digital storage oscilloscopes has expanded, applications have been found that take advantage of the abilty of these instruments to record and display at a later time waveforms that are not repetitive. These applications can require triggering capabilities that focus on rare or anomalous occurrences, as opposed to repetitive signals. When the operation of digital circuitry is being analyzed, departures from normal digital signal behavior may constitute the events that are of interest to the user. U.S. Pat. No. 5,097,147 to Stuebing et al. for a "Limited Amplitude Signal Trigger Circuit", hereby incorporated by reference, discloses a trigger generation circuit that compares an input signal to two different thresholds and only generates a trigger output when the amplitude of the input signal crosses one threshold twice without having crossed the other threshold in-between. This type of circuit is used to detect a faulty digital signal that leaves one defined logic state, but fails to reach the other defined logic state.

As digital oscilloscopes have become increasingly used to monitor the behavior of signals in a complex digital environment, they have been equipped with triggering capabilities that are more appropriate to an environment with numerous digital signals. One such capability is the ability to establish a desired trigger time based on a Boolean combination of logic states of a number of digital signals. U.S. Pat. No. 4,585,975 to Wimmer for a "High Speed Boolean Logic Trigger Oscilloscope Vertical Amplifier with Edge Sensitivity and Nested Trigger", hereby incorporated by reference, discloses an oscilloscope having triggering capabilities resembling those used in logic analyzers, instruments designed to monitor the activities of a large number of digital signal lines simultaneously. It can be programmed to trigger when a particular parallel "word" (pattern) appears on the signal lines that it is monitoring. It can also be programmed to wait until a word has persisted for a specified time, or to trigger on a sequence of words appearing in a specified order. It can also produce triggers in response to particular edge transitions while other signals are in a specified state.

Set up and hold times are specifications that define, respectively, the time before a clock signal that data should be present and stable to guarantee that it is properly accepted and the time after a clock signal that data should continue to be present and stable to provide the same guarantee. Since failure to provide stable data during these intervals can lead to metastable conditions and improper circuit operation, being able to identify such occurrences is a highly desirable feature of a logic analyzer or an oscilloscope.

U.S. Pat. No. 4,968,902 to Jackson for an "Unstable Data Recognition Circuit for Dual Threshold Synchronous Data", hereby incorporated by reference, discloses a circuit that allows digital data acquisition instruments to recognized when data is monitored with dual thresholds. The dual thresholds are typically set to correspond to the voltage levels that define a clear logic "1" and a clear logic "0", with gap between them defining an undeterminate logic level, or transitional state. During the time that a signal's voltage level is between levels an "unstable" signal is generated. Local unstable signals for a single line may be ORed together to produce an unstable signal for a collection of data signals. If the digital data lingers between the dual thresholds for too long, a problem is indicated. By measuring the time from the beginning of an unstable signal to the occurrence of the active clock edge, set up time violations can be detected. And, by measuring the time from the active clock edge to the end of the unstable signal, hold time violations can be measured.

The circuitry described in the '902 Jackson patent is suitable for use in a logic analyzer, where precise trigger placement is not extremely important, but its usefulness for oscilloscopes is limited by its lack of trigger placement precision. When this circuit monitors hold time violations, the resulting trigger is referenced to the end of the violation, rather than to the active clock edge at the beginning of the hold time that created the violation. In a logic analyzer this would be good enough, since the trigger would then be associated with the next acquisition clock pulse, but in an oscilloscope with a higher sample rate in which it is desired to precisely position the trigger location this imprecision is not satisfactory.

U.S. Pat. No. 5,124,597 to Stuebing et al. for a "Timer Circuit Including an Analog Ramp Generator and a CMOS Counter", hereby incorporated by reference, discloses a timer circuit and several applications for that timer circuit including triggering on a pulse width within limits, triggering on a pulse width that is outside of limits, and triggering on glitches of either polarity.

A more complex apparatus for generating a trigger signal is described in U.S. Pat. No. 4,823,076 to Haines et al. for a "Method and Apparatus for Triggering", hereby incorporated by reference. The apparatus disclosed in this patent includes a word recognizer and a state machine, the state machine including timing means. This circuitry can produce clock-based trigger modes and time-based trigger modes. The clock based trigger modes include single event triggering, nested event triggering, and consecutive and exception event triggering. The time-based trigger modes include all of the same modes as are available in the clock-based modes, plus set up and hold time triggering, transition time triggering, and sliver pulse triggering. This patent also includes a fairly comprehensive review of the prior art capabilities provided by the instruments produced by several manufacturers.

While the apparatus disclosed in the Haines et al. patent described above is capable of producing a trigger in response either set up time violations or hold time violations, it requires a lot of circuitry and it would be desirable to find a simpler approach. And, while the circuitry shown in Haines et al. has a mode in which it is capable of producing a trigger in response to a set up violation, and another mode in which it is capable of producing a trigger in response to a hold violation, it does not have a mode in which it produces such a trigger in response to either a set up time violation or a hold time violation in the same waveform acquisition.

Another limitation of the approach taken in the Haines et al. patent is the fact that the triggers that it produces in the set up time violation mode have their timing determined by and referenced to the timing of the user's clock signal, while the triggers that it produces in the hold time violation mode have their timing determined by and referenced to the timing of the user's data signal. It would be preferable if triggers caused by both types of violations were determined by and referenced to the user's clock signal.

SUMMARY OF THE INVENTION

According to one embodiment of the present invention, a circuit and corresponding method are provided for generating a trigger signal upon the occurrence of either set up or hold time violations in the same waveform acquisition, with the trigger signal being referenced to, but displaced in time from, the input clock signal. Transitions in a data signal initiate a window pulse whose duration is equal to the sum of a set up time requirement and a hold time requirement. The window pulse is used as the D input to a flip-flop that is clocked by a version of a clock signal whose active edge is has been delayed for an interval that corresponds to the hold time requirement. The output of the flip-flop is a trigger signal that only occurs when a set up or hold time violation has occurred. The trigger signal is coupled back to a reset input of the flip-flop through a delay element to limit the trigger signal's duration.

According to another embodiment of the invention, trigger timing jitter is minimized, but triggers generated as the result of a set up time violation are referenced to the clock edge, while triggers that are generated as the result of a hold time violation are referenced to a transition in the data signal. In this embodiment, data transitions initiate a pulse whose duration corresponds to the specified set up time and this pulse is applied to the D input of a first flip-flop that is clocked by the clock signal. A second flip-flop is clocked by data transitions and receives at its D input a pulse that is initiated by an active edge of the clock signal and whose duration is the specified hold time. The outputs of the first and second flip-flops, representing respectively set up time violations and hold time violations, are ORed to produce an output trigger signal. As above, the output trigger signal is coupled back to the reset inputs of both flip-flops to limit the duration of the output trigger signal.

BRIEF DESCRIPTION OF THE DRAWINGS

FIGS. 6A and 6B are idealized timing diagrams illustrating the operation of the circuitry shown in FIG. 5.

DETAILED DESCRIPTION OF THE INVENTION

Figure 1:
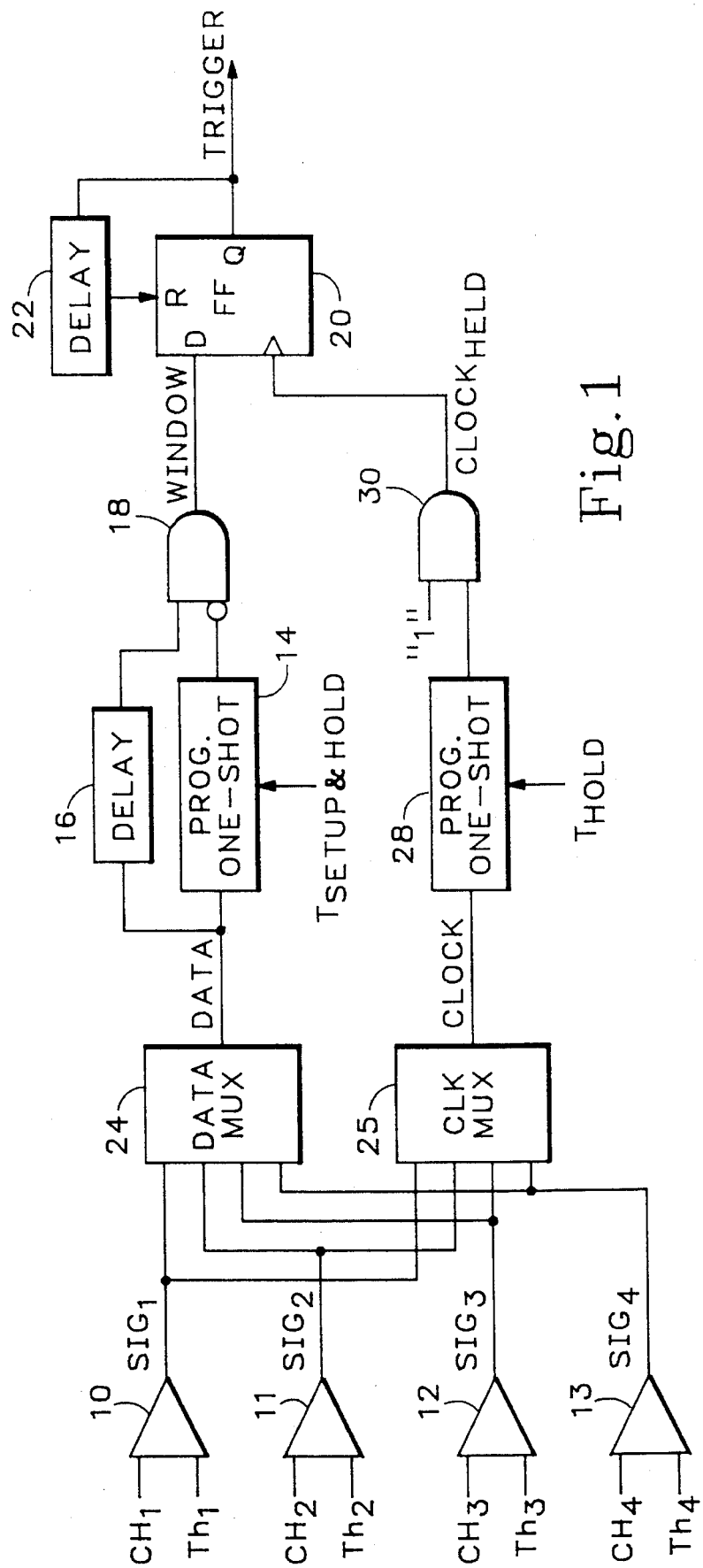
FIG. 1 is a schematic diagram of a trigger generation circuit according to the present invention.

Referring to FIG. 1, comparators 10–13 compare four channels of input signals, $CH_1$–$CH_3$, with respective thresholds $Th_1$ through $Th_3$ to produce four digital signals $SIG_1$–$SIG_3$ that are indicative of the times that the input signals cross their respective thresholds. Data multiplexer 24 and clock multiplexer 25 select from $SIG_1$–$SIG_3$ to produce DATA and CLOCK signals, respectively.

The DATA signal is applied to the input of programmable delay one-shot circuit 14 and to the input of delay element 16. The output of delay element 16 is one input to AND gate 18, while the output of the programmable delay one-shot circuit 14 is the input to an inverting input to AND gate 18. The CLOCK signal is applied to the input of programmable delay one-shot circuit 28. The output of programmable delay one-shot circuit 28 is delayed for one gate delay by delay matching gate 30. Programmable delay one-shot circuit 14 is preloaded with a delay value $T_{SETUP\&HOLD}$ corresponding to the sum of the desired set up time and the desired hold time. Programmable delay one-shot circuit 28 is preloaded with a delay value $T_{HOLD}$ representing the hold time specification alone. The output of AND gate 18 is a WINDOW signal that is applied to the D input of flip-flop 20. Flip-flop 20 is clocked by the $CLOCK_{HELD}$ signal, which is the output of delay matching gate 30. The TRIGGER output of flip-flop 20 is coupled back to a reset input via delay element 22.

Figure 2:
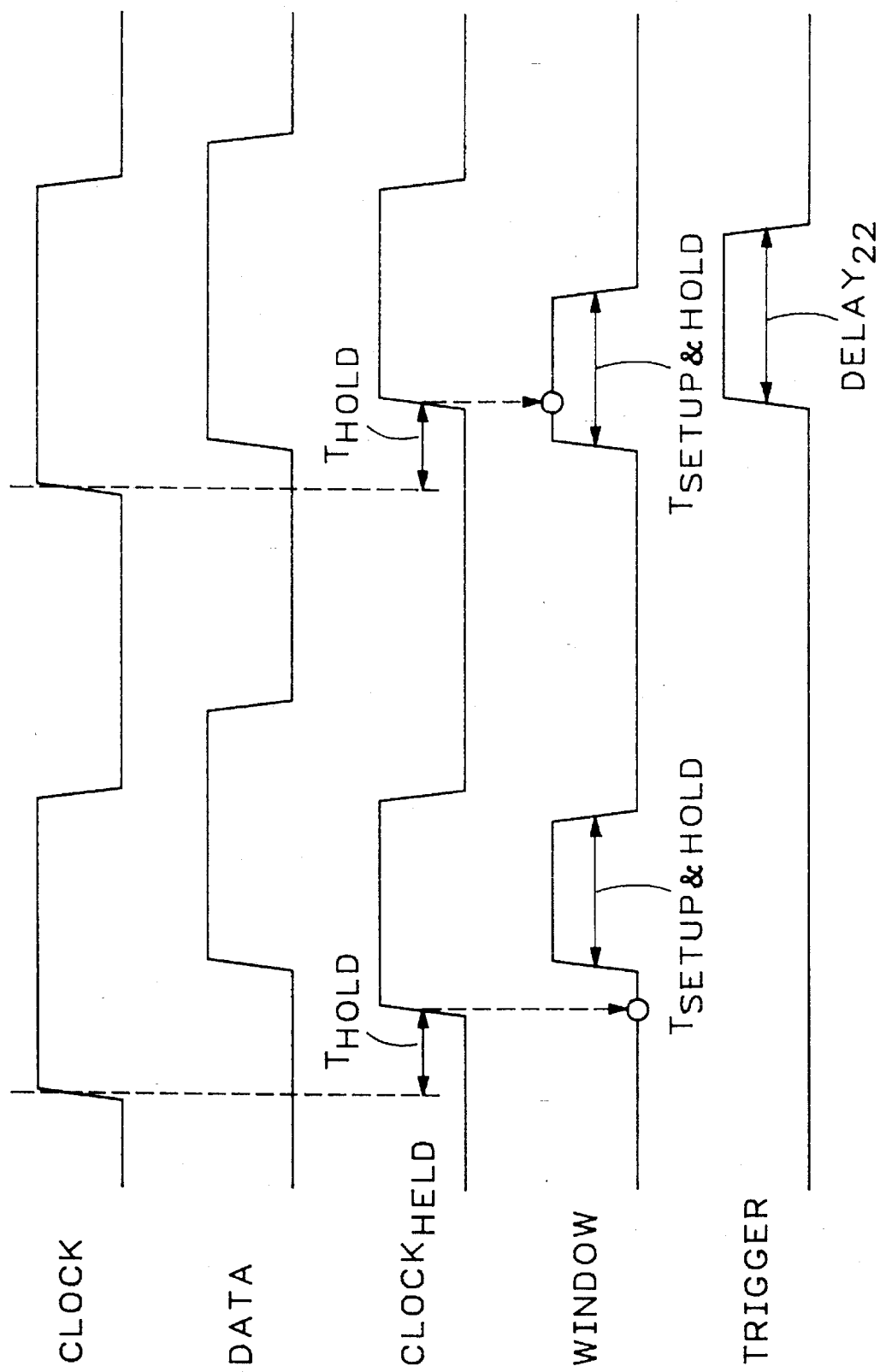
FIG. 2 is an idealized timing diagram illustrating the operation of the circuit shown in FIG. 1.

Referring now to FIG. 2, as well as to FIG. 1, when CLOCK goes high, the output of programmable delay one-shot 28, $CLOCK_{HELD}$, goes high after delay $T_{HOLD}$. When CLOCK goes low, $CLOCK_{HELD}$ goes low at virtually the same time. Thus, $CLOCK_{HELD}$ is a version of CLOCK whose leading, but not trailing, edge has been delayed by $T_{HOLD}$. U.S. Pat. No. 5,124,597 to Stuebing et al. for a "Timer Circuit Including an Analog Ramp Generator and a CMOS Counter", previously incorporated by reference, discloses a circuit that is well suited for use as the programmable delay one-shot circuits 14 and 28. The output of this circuit goes high a programmable time (delay value) after its input goes high, and returns to low whenever its input goes low.

When DATA goes high, the output of delay element 16 goes high after a short time that is equal to the insertion delay (at reset) of the programmable delay one-shot circuit 14. Note that FIG. 2 has been "idealized" and does not show these propagation delays, since they have been compensated for by keeping equivalent delays in both the DATA and CLOCK paths. Since the $T_{SETUP\&HOLD}$ value is a positive number, when the output of delay element 16 goes high, the WINDOW signal will go high because the delay of the programmable delay one-shot has not yet timed out, and since its low output is inverted it therefore satisfies AND gate 18. When the $T_{SETUP\&HOLD}$ time has passed and the output of the programmable delay one-shot circuit goes high, AND gate 18 is disabled and WINDOW goes low. WINDOW is thus a pulse that goes active high in response to the rising edge of DATA, but which only persists in that state for the duration of $T_{SETUP\&HOLD}$.

While the small delay of delay element 16 was described above as providing a delay "equal to" the insertion delay (at reset) of programmable delay one-shot circuit 14, for glitch-free operation the delay should actually be very slightly less than that insertion delay to ensure that it is not longer. If the delay through delay element 16 is slightly longer than the insertion delay of the programmable delay one-shot 14, glitches will occur on the output of AND gate 18 when the output of the programmable delay one-shot 14 returns to low and the inverted input to AND gate 18 is satisfied at the same time that the other input remains satisfied.

At the time that the $CLOCK_{HELD}$ signal clocks flip-flop 20, the WINDOW signal on its D input is either low, as shown at the left of FIG. 2, or high, as shown on the right in FIG. 2. If WINDOW is low when flip-flop 20 is clocked, the output of the flip-flop remains low and no active TRIGGER pulse occurs. If WINDOW is high when the active edge of $CLOCK_{HELD}$ occurs, the output of flip-flop 20 goes high and an active TRIGGER pulse is generated. Since this TRIGGER output is coupled back to the reset input of flip-flop 20 through delay element 22, the TRIGGER signal returns to its inactive state after a time interval that is substantially determined by delay element 22, $DELAY_{22}$.

It should be noted that the circuit of FIG. 1 can be programmed to detect violations of a negative set up time requirement by programming programmable one-shot circuit 28 with a $T_{HOLD}$ value that is greater than the $T_{SETUP\&HOLD}$ value with which programmable one-shot circuit 14 is programmed.

Figure 3:
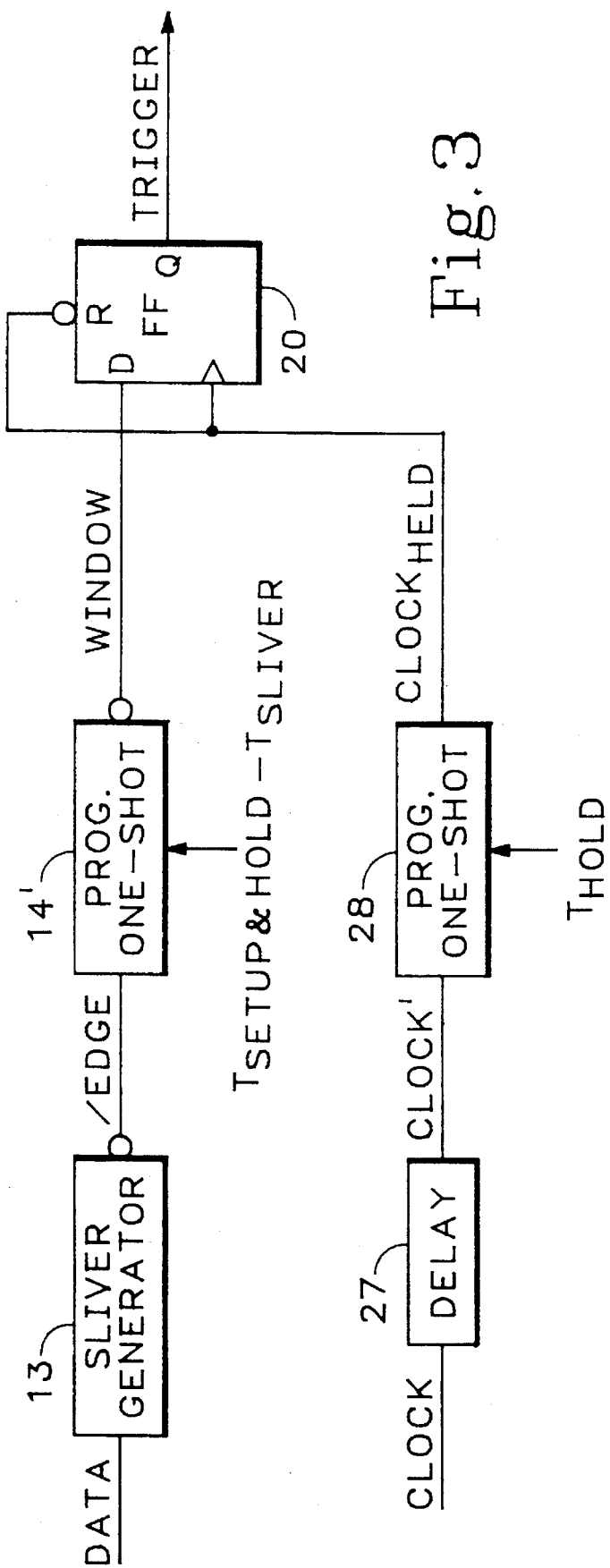
FIG. 3 is a schematic diagram of another trigger generation circuit according to the present invention.

The circuitry shown in FIG. 1, and whose operation is illustrated in FIG. 2, only identifies set up and hold violations that occur in connection with the positive-going transitions of the DATA signal. FIG. 3 shows an alternative embodiment of the trigger generation circuit of the present invention that identifies set up and hold timing violations that occur in connection with either transition of the DATA signal. The circuitry shown in this figure has been modified to allow both edges to be monitored by the addition of sliver generator 13 in the DATA path and a corresponding delay element 27 in the CLOCK path, the delay corresponding to the sliver pulse width plus the insertion delay of the sliver pulse generator 13.

The programmable delay one-shot circuit 14' operates somewhat differently than the programmable delay one-shot circuit 14 of FIG. 1 because of differences in its environment. Specifically, without the delay element 16 and AND gate 18 shown in FIG. 1 the delay produced by the programmable delay one-shot circuit 14' with its inverted input and output is the programmed delay plus the width of the input signal /EDGE, $T_{SLIVER}$. Therefore, the actual delay produced when the programmable delay one-shot 14' is programmed with $T_{SETUP\&HOLD}-T_{SLIVER}$ is $T_{SETUP\&HOLD}$. In this implementation, the inverted output of the programmable one-shot circuit 14' is the WINDOW signal.

The circuit shown in FIG. 3 also has another difference from that shown in FIG. 1, in that the flip-flop 20 is now reset by an inverted version of the $CLOCK_{HELD}$ signal. This alternative could have also been used with the circuit shown in FIG. 1, or the FIG. 1 approach could have been used here, i.e., feeding back the output TRIGGER signal through a delay element 22 to reset flip-flop 20.

Figure 4:
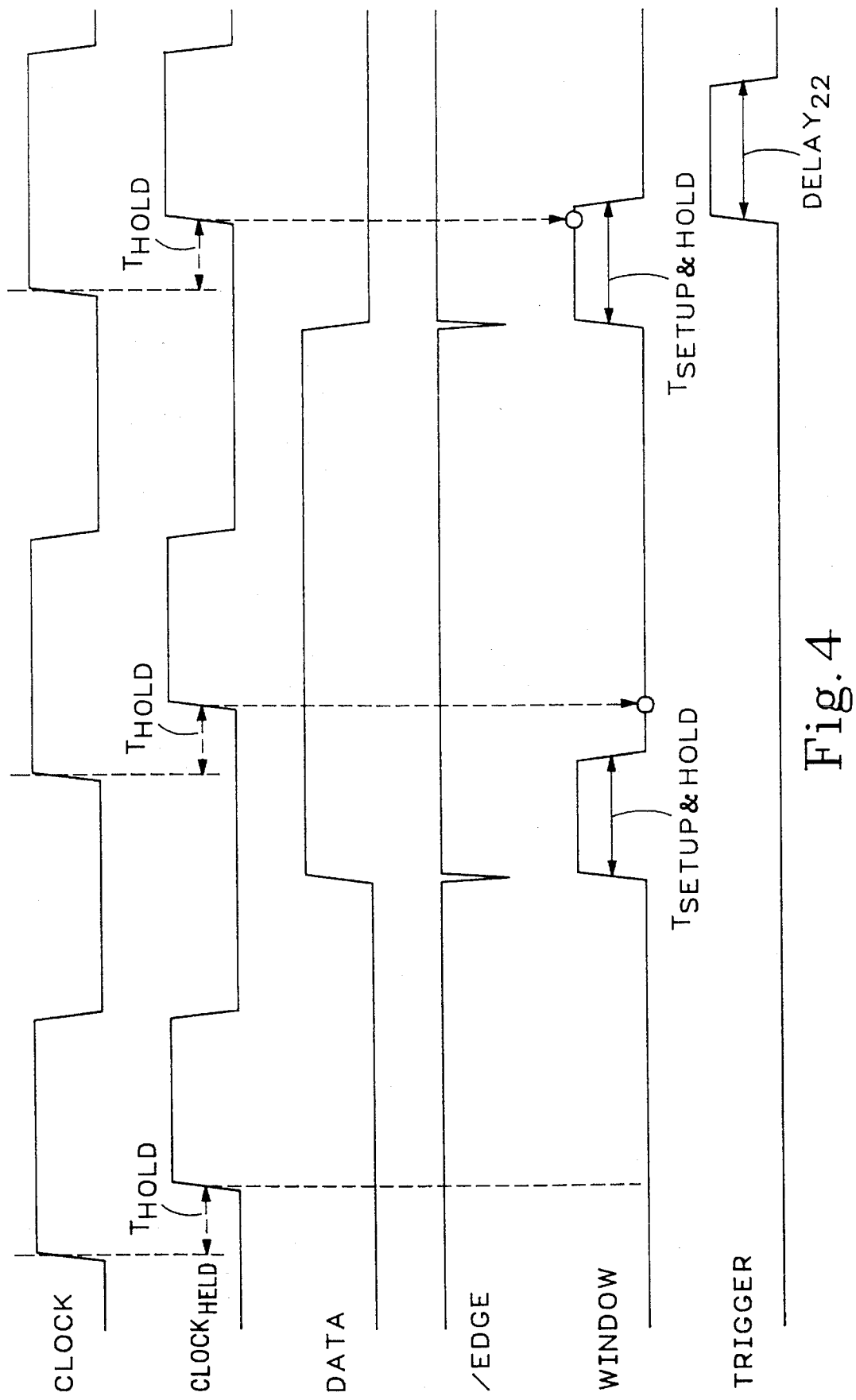
FIG. 4 is an idealized timing diagram illustrating the operation of the circuit shown in FIG. 3.

Referring now to FIG. 4, as well as FIG. 3, the sliver generator 13 produces a /EDGE (not-edge) pulse with a very short duration whenever the DATA signal on its input changes state in either direction. A sliver generator can be created by applying the DATA signal and a slightly delayed version of the DATA signal to the inputs of an XOR (exclusive-OR) gate. The output of the sliver generator is inverted so that it is normally high and goes negative briefly in response to changes on its input.

The normally high input to the programmable delay one-shot circuit 14' keeps its inverted output WINDOW normally low. The low-going /EDGE pulse resets the programmable delay one-shot circuit 14' and causes its inverted output WINDOW to go high. The high-going trailing edge of the /EDGE pulse that follows immediately starts the programmable delay time $T_{SETUP\&HOLD}$. At the end of $T_{SETUP\&HOLD}$ the WINDOW signal inverted output of the programmable delay one-shot circuit 14' returns to low. Thus, the width of the WINDOW pulse is the programmed time plus the time between the leading and trailing edges of /EDGE, $T_{SLIVER}$, i.e., $T_{SETUP\&HOLD}$.

As in the circuit described above in connection with FIGS. 1 and 2, the occurrence of the rising (active) edge of $CLOCK_{HELD}$ clocks the flip-flop 20, whose D input is either high or low depending on the timing of the high-going pulse on the WINDOW signal line. As before, if WINDOW is high when the active edge of $CLOCK_{HELD}$ occurs, a TRIGGER pulse is produced; and, if WINDOW is low at the time of the active $CLOCK_{HELD}$ edge, no TRIGGER pulse is produced.

The TRIGGER signal produced by the method described above is displaced in time from its proper relationship to the DATA by one $T_{HOLD}$ interval, but once that adjustment is made it is correctly aligned with the user clock signal that produced it except for any jitter that may have been introduced by the programmable delay one-shot circuits 14 (or 14') and 28. One suitable method for making the required time adjustment is shown in the '597 patent to Stuebing referred to previously. The jitter produced by the programmable delay one-shot circuits 14,14' and 28 disclosed in the '597 patent is approximately 1% of the ramp duration for durations that are less than one microsecond and hence suitable for use here.

Figure 5:
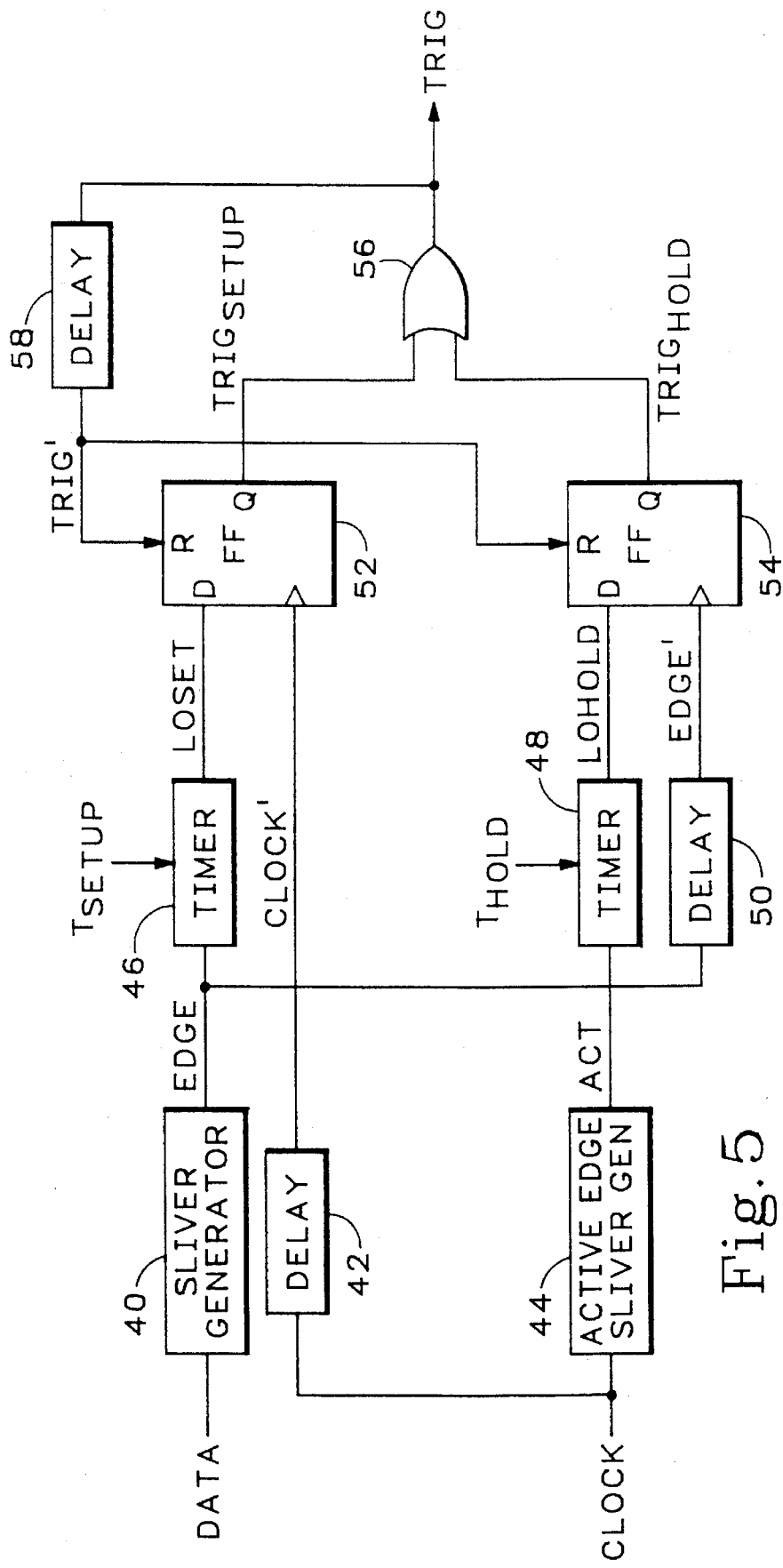
FIG. 5 is a schematic diagram of yet another trigger generation circuit according to the present invention.

FIG. 5 shows another alternative embodiment of the present invention. This embodiment has less timer induced jitter, but the resulting trigger output signal, TRIG, is referenced to the DATA signal when TRIG is derived from a hold time violation, and the user CLOCK signal when TRIG is derived from a set up time violation.

Referring to FIG. 5, the DATA signal is applied to the input of sliver generator 40, while the CLOCK signal is applied to the input of active edge sliver generator 44 and to the input of delay element 42. The output of sliver generator 40, EDGE, is applied to the input of timer 46 and delay element 50. The output of the active edge sliver generator 44, ACT, is applied to the input of timer 48. The timers 46 and 50 are of a type that is reset by a positive signal on its input, and which commence counting when that input goes negative. Timer 46 is preloaded with the value $T_{SETUP}$ and timer 48 is preloaded with the value $T_{HOLD}$.

Sliver generator 40 is suitably the same as the sliver generation 13 described in connection with FIG. 3, except that its output is not inverted. The output of the sliver generator 40 is the EDGE signal, which is a positive-going sliver with a width corresponding to the propagation delay through inverter 60. This sliver, the EDGE signal, occurs following both positive-going and negative-going transitions in the DATA signal.

An active edge sliver generator 44 can be constructed from an inverter and an AND gate, with the AND gate receiving as its inputs the CLOCK signal and the slightly delayed and inverted version of the CLOCK signal that has passed through the inverter. The output of the AND gate is then the ACT signal, which is a positive-going sliver with a width corresponding to the propagation delay through inverter. This sliver, the ACT signal, occurs following positive-going transitions in the CLOCK signal. The active edge sliver generator just described can be altered to respond to negative going rather than positive-going transitions by the addition of another inverter at its input.

The output of timer 46 is a signal, LOSET, that goes active when the setup time requirement has not been met. LOSET is applied to the D input of flip-flop 52, which receives as its clock input CLOCK' from delay element 42. The output of timer 48 is a signal, LOHOLD, that goes active when the hold time requirement has not been met. LOHOLD is applied to the D input of flip-flop 54, which receives as its clock input the EDGE' signal from delay element 50. The Q outputs of flip-flop 52 and flip-flop 54, $TRIG_{SETUP}$ and $TRIG_{HOLD}$ respectively, are ORed by OR gate 56 to produce the final trigger output TRIG. Flip-flops 52 and 43 are both reset by TRIG', which is a version of TRIG-that has been delayed by delay element 58.

Referring now to FIG. 6A, as well as to FIG. 5, the sliver generator 40 produces an EDGE sliver in response to either a positive or negative going transition of DATA. The trailing edge of EDGE causes the timer 46 to initiate a LOSET pulse, which then persists for $T_{SETUP}$. If the rising edge of CLOCK' occurs while LOSET is (active) high, a $TRIG_{SETUP}$ pulse is initiated. This does not occur during the first or third occurrences of LOSET active shown in FIG. 6A, but it does during the second occurrence to produce the single active $TRIG_{SETUP}$ pulse shown. The $TRIG_{SETUP}$ pulses, when they are produced, last for $DELAY_{58}$, the delay produced by delay element 58.

Figure 6B:
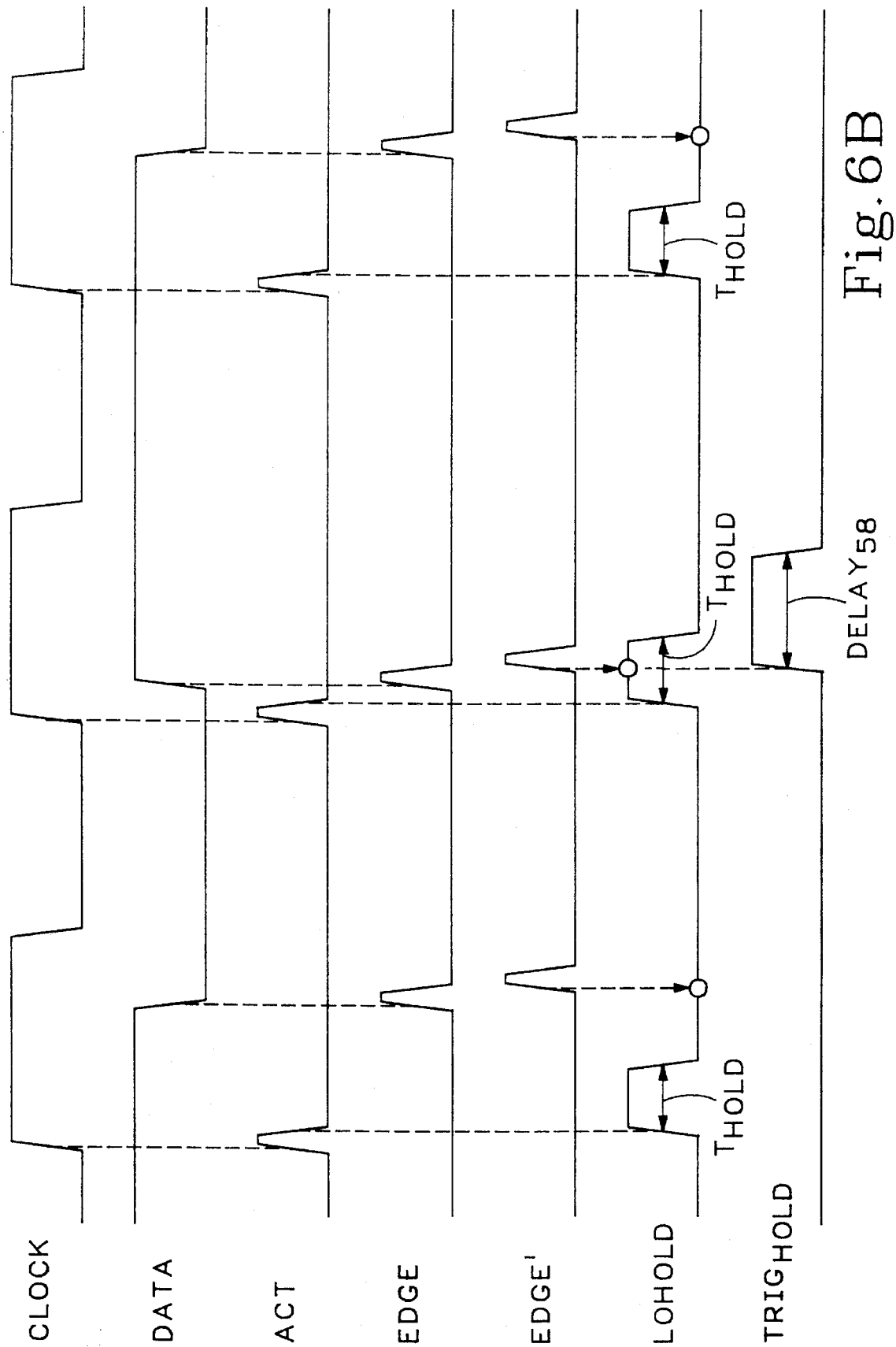

Referring now to FIG. 6B, as well as to FIG. 5, the active edge sliver generator 44 produces a positive-going ACT sliver in response to the positive-going transitions of the CLOCK signal. The falling edge of ACT causes the timer 48 to produce a LOHOLD pulse, which then persists for $T_{HOLD}$. Delay element 50 delays EDGE by an interval corresponding to the width of the ACT slivers, so that EDGE' has the correct timing relative to the LOHOLD pulse. If the rising edge of EDGE' occurs while LOHOLD is (active) high, a $TRIG_{HOLD}$ pulse is initiated. This does not occur during the first or third occurrences of LOHOLD active shown in FIG. 6B, but it does during the second occurrence to produce the single active $TRIG_{HOLD}$ pulse shown. The $TRIG_{HOLD}$ pulse, like the $TRIG_{SETUP}$ pulse, lasts for $DELAY_{58}$, the delay produced by delay element 58.

Note that in this implementation, the TRIG signal out is referenced to the CLOCK signal when it occurs as the result of a set up time violation, but is referenced to the DATA transition when the TRIG signal occurs as the result of a hold time violation. While this may be less desirable than the constant referencing to the CLOCK signal that is provided by the embodiments shown in FIGS. 1 and 3 for some applications, for others the superior absence of jitter provided by this circuit is more important.

While several embodiments of the present invention have been shown and described, it will be apparent to those skilled in the art that many changes and modifications may be made without departing from the invention in its broader aspects. The claims that follow are therefore intended to cover all such changes and modifications as fall within the true scope and spirit of the invention.

We claim:

1. A method for producing a trigger signal when a data signal makes a transition between logic states at a time that violates set up or hold time requirements relative to an active edge of a clock signal, the method comprising the steps of:

generating a window pulse when the data signal undergoes a transition in logic state, the window pulse having a duration of a first time interval, the first time interval corresponding to the sum of a set up time requirement and a hold time requirement;

delaying an active edge of the clock signal for a second time interval, the second time interval corresponding to the hold time requirement;

applying the window pulse to a data input of a bit storage means;

clocking the bit storage means with the delayed active edge of the clock signal, the bit storage means thereby producing the output trigger pulse if the first pulse was active when the clocking occurred; and resetting the bit storage means with a delayed version of the output trigger pulse to terminate the output trigger pulse after a third time interval.

2. A circuit for producing a trigger signal when a data signal makes a transition between logic states at a time that violates set up or hold time requirements relative to an active edge of a clock signal, the circuit comprising:

means (14,14') for generating a window pulse when the data signal undergoes a transition in logic state, the window pulse having a duration of a first time interval, the first time interval corresponding to the sum of a set up time requirement and a hold time requirement;

means (28) for delaying an active edge of the clock signal for a second time interval, the second time interval corresponding to the hold time requirement;

means for applying the window pulse to a data input of a bit storage means (20);

means for clocking the bit storage means (20) with the delayed active edge of the clock signal, the bit storage means (20) thereby producing the output trigger pulse if the first pulse was active when the clocking occurred; and means (22) for resetting the bit storage means with a delayed version of the output trigger pulse to terminate the output pulse after a third time interval.

3. A method for producing a trigger signal when a data signal makes a transition between logic states at a time that violates set up or hold time requirements relative to an active edge of a clock signal, the method comprising the steps of:

starting an active period of a first pulse when a transition in the data signal occurs, the first pulse having a duration corresponding to a set up time requirement;

producing a set up time violation signal if an active clock edge occurs during the active period of the first pulse;

commencing an active period of a second pulse when the active clock edge occurs, the second pulse having a duration corresponding to a hold time requirement;

producing a hold time violation signal if a transition in the data signal occurs during the active period of the second pulse; and ORing the set up time violation signal and the hold time violation signal to create a trigger signal indicative of a set up time violation or a hold time violation.

4. A method according to claim 3 wherein the starting step comprises the step of generating a sliver signal upon the occurrence of each transition of the data signal, the sliver signal being used to start the active period of the first pulse.

5. A method according to claim 4 further comprising the step of delaying the clock signal to compensate for a delay associated with generating the sliver signal.

6. A method according to claim 3 wherein the commencing step comprises the step of generating a short pulse upon the occurrence of each active edge of the clock signal, the short pulse being used to start the active period of the second pulse.

7. A method according to claim 6 further comprising the step of delaying the transition in the data signal to compensate for a delay associated with generating the short pulse.

8. A circuit for producing a trigger signal when a data signal makes a transition between logic states at a time that violates set up or hold time requirements relative to an active edge of a clock signal, the circuit comprising:

means (46) for starting an active period of a first pulse when a transition in the data signal occurs, the first pulse having a duration corresponding to a set up time requirement;

means (52) for producing a set up time violation signal if an active clock edge occurs during the active period of the first pulse;

means (48) for commencing an active period of a second pulse when the active clock edge occurs, the second pulse having a duration corresponding to a hold time requirement;

means (54) for producing a hold time violation signal if a transition in the data signal occurs during the active period of the second pulse; and means (56) for ORing the set up time violation signal and the hold time violation signal to create a trigger signal indicative of a set up time violation or a hold time violation.

9. A circuit according to claim 8 wherein the starting means (46) comprises means (40) for generating a sliver signal upon the occurrence of each transition of the data signal, the sliver signal being used to start the active period of the first pulse.

10. A circuit according to claim 9 further comprising means (42) for delaying the clock signal to compensate for a delay associated with the means (40) generating the sliver signal.

11. A circuit according to claim 8 wherein the commencing means (48) comprises the means (44) for generating a short pulse upon the occurrence of each active edge of the clock signal, the short pulse being used to start the active period of the second pulse.

12. A circuit according to claim 11 further comprising means (50) for delaying the transition in the data signal to compensate for a delay associated with the means (44) for generating the short pulse.

* * * * *